United States Patent
Jeon et al.

(10) Patent No.: US 9,263,105 B2
(45) Date of Patent: Feb. 16, 2016

(54) MEMORY SYSTEMS INCLUDING AN INPUT/OUTPUT BUFFER CIRCUIT

(71) Applicant: Samsung Electronics Co., Ltd., Suwon-si (KR)

(72) Inventors: Youngjin Jeon, Hwaseong-si (KR); Jeongdon Ihm, Seongnam-si (KR); Kilsoo Kim, Hwaseong-si (KR); Jinman Han, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 11 days.

(21) Appl. No.: 14/143,154

(22) Filed: Dec. 30, 2013

(65) Prior Publication Data
US 2014/0185389 A1    Jul. 3, 2014

(30) Foreign Application Priority Data
Jan. 3, 2013 (KR) .................. 10-2013-0000626

(51) Int. Cl.
G11C 7/10    (2006.01)
G11C 7/22    (2006.01)
G11C 7/04    (2006.01)

(52) U.S. Cl.
CPC ............ *G11C 7/1084* (2013.01); *G11C 7/1093* (2013.01); *G11C 7/1096* (2013.01); *G11C 7/222* (2013.01); *G11C 7/04* (2013.01)

(58) Field of Classification Search
None
See application file for complete search history.

(56) References Cited

U.S. PATENT DOCUMENTS

| | | | |
|---|---|---|---|
| 7,267,287 B2 | 9/2007 | Nishizawa et al. | |
| 7,464,225 B2 | 12/2008 | Tsern | |
| 7,622,799 B2 | 11/2009 | Kuroda et al. | |
| 7,880,312 B2 | 2/2011 | Okumura | |
| 7,981,788 B2 | 7/2011 | Muto et al. | |
| 7,989,960 B2 | 8/2011 | Shinohara et al. | |
| 8,022,523 B2 | 9/2011 | Chen et al. | |
| 8,082,378 B1 | 12/2011 | Pritchard et al. | |
| 8,088,648 B2 | 1/2012 | Jo et al. | |
| 8,108,643 B2 | 1/2012 | Wallner et al. | |
| 8,134,852 B2 | 3/2012 | Kim et al. | |
| 2007/0191993 A1* | 8/2007 | Wyatt ............................ | 700/299 |
| 2010/0091537 A1* | 4/2010 | Best et al. ..................... | 365/51 |
| 2010/0118482 A1 | 5/2010 | Kim | |
| 2010/0200998 A1 | 8/2010 | Furuta et al. | |
| 2011/0161568 A1 | 6/2011 | Bruce et al. | |
| 2011/0231739 A1* | 9/2011 | Kim ................... | G06F 11/1048 714/773 |
| 2013/0321041 A1* | 12/2013 | Kim et al. ...................... | 327/113 |

FOREIGN PATENT DOCUMENTS

| | | |
|---|---|---|
| JP | 2006-351664 | 12/2006 |
| JP | 2010-186764 | 8/2010 |
| KR | 10-2007-0057337 A | 6/2007 |

* cited by examiner

*Primary Examiner* — James G Norman
(74) *Attorney, Agent, or Firm* — Myers Bigel Sibley & Sajovec, PA

(57) ABSTRACT

Memory systems are provided. A memory system may include a plurality of nonvolatile memories and a memory controller configured to control the plurality of nonvolatile memories. Moreover, the memory system may include an input/output buffer circuit connected between the memory controller and the plurality of nonvolatile memories. A data channel may be connected between the memory controller and the input/output buffer circuit, and first and second internal data channels may be connected between the input/output buffer circuit and respective first and second groups of the plurality of nonvolatile memories. The input/output buffer circuit may be configured to connect the data channel to one of the first and second internal data channels.

16 Claims, 9 Drawing Sheets

MEMORY SYSTEMS INCLUDING AN INPUT/OUTPUT BUFFER CIRCUIT

CROSS-REFERENCE TO RELATED APPLICATION

This U.S. non-provisional patent application claims priority under 35 U.S.C. §119 to Korean Patent Application No. 10-2013-0000626, filed Jan. 3, 2013 in the Korean Intellectual Property Office, the disclosure of which is hereby incorporated herein by reference in its entirety.

BACKGROUND

The present disclosure relates to memory systems. A semiconductor memory device may be volatile or nonvolatile. A nonvolatile semiconductor memory device may retain contents stored therein even at power-off. Data stored at the nonvolatile semiconductor memory device may be permanent or reprogrammable according to a memory manufacturing technology. The nonvolatile semiconductor memory device may be used to store programs, micro codes, user data in a wide range of applications such as computers, avionics, communications, consumer electronics, and so on.

SUMMARY

Various embodiments of the present inventive concepts provide a memory system. The memory system may include a nonvolatile memory package. The memory system may include a memory controller configured to control the nonvolatile memory package. The nonvolatile memory package may include groups of nonvolatile memory devices respectively connected to internal data channels. The memory system may include an input/output buffer circuit configured to connect a data channel to one of the internal data channels when data signals are input to or output from the memory controller via the data channel. The input/output buffer circuit may include an input/output unit configured to operate in a program operation. The input/output unit may include a receiver configured to receive the data signals from the memory controller. The input/output unit may include a sampler configured to sample the data signals from the receiver in response to a data strobe signal to output internal data signals. The input/output unit may include a delay locked loop circuit configured to generate an internal data strobe signal by performing delay synchronization on the data strobe signal. The input/output unit may include a de-multiplexer configured to connect the data channel to one of the internal data channels based on at least one control signal input from the memory controller. The input/output unit may include output drivers configured to receive the internal data signals output from the sampler via the de-multiplexer and to output the internal data signals to the one of the internal data channels connected to the data channel. Moreover, the internal data strobe signal and the internal data signals may be output to one of the groups of nonvolatile memory devices.

In various embodiments, the nonvolatile memory devices may include stacked nonvolatile memory devices. In some embodiments, the input/output buffer circuit may be directly connected to the stacked nonvolatile memory devices via wire bonding. In some embodiments, the input/output buffer circuit and the stacked nonvolatile memory devices may be connected via a printed circuit board, where at least one of the stacked nonvolatile memory devices may on the printed circuit board, and where the input/output buffer circuit and the stacked nonvolatile memory devices may have a side-by-side structure.

According to various embodiments, the nonvolatile memory package and the memory controller may be in a chip on a printed circuit board. In some embodiments, the nonvolatile memory package and the memory controller be separate chips, respectively. Moreover, the memory controller may be on a printed circuit board.

In various embodiments, the input/output buffer circuit may include a temperature measuring unit configured to measure a temperature of the nonvolatile memory package and to transfer temperature information corresponding to the temperature to the memory controller.

According to various embodiments, the input/output unit may include a first input/output unit, the receiver may include a first receiver, the data signals may include first data signals, the at least one control signal may include at least one first control signal, the delay locked loop circuit may include a first delay locked loop circuit, the internal data strobe signal and the data strobe signal may include a first internal data strobe signal and a first data strobe signal, respectively, and the output drivers may include first output drivers. Moreover, the input/output buffer circuit may include a second input/output unit configured to operate in a read operation. The second input/output unit may include a second receiver configured to receive second internal data signals from one of the groups of nonvolatile memory devices connected to a first or second one of the internal data channels. The input/output buffer circuit may include a multiplexer configured to connect the data channel to the first or second one of the internal data channels based on at least one second control signal input from the memory controller. The input/output buffer circuit may include a second delay locked loop circuit configured to generate a second data strobe signal by delay synchronizing a second internal data strobe signal output from the one of the groups of nonvolatile memory devices connected to the first or second one of the internal data channels. The input/output buffer circuit may include a second sampler configured to receive the second internal data signals output from the second receiver via the multiplexer and to sample the second internal data signals in response to the second data strobe signal to output second data signals. The input/output buffer circuit may include second output drivers configured to output the second data signals that are output from the second sampler, to the data channel, and configured to output the second data strobe signal.

In various embodiments, the input/output buffer circuit may be configured to, in the program operation or a read operation, sample data signals in response to a clock transferred from the memory controller to input and output the sampled data signals. In some embodiments, the internal data channels may include a first internal data channel and a second internal data channel. In some embodiments, the input/output buffer circuit may include a re-timing circuit configured to connect the data channel to the first internal data channel or the second internal data channel in response to a selection signal during the program operation or a read operation. In some embodiments, the input/output buffer circuit may include a status decision logic circuit configured to receive a control signal from the memory controller and to generate the selection signal using the control signal. Moreover, in some embodiments, the input/output buffer circuit may include a read enable pad configured to receive a read enable signal from the memory controller, and may include first and second internal read enable pads connected to the read enable pad via at least one output driver.

A memory system, according to various embodiments, may include a nonvolatile memory package. The memory system may include a memory controller connected to the nonvolatile memory package via a plurality of channels and configured to control the nonvolatile memory package. The nonvolatile memory package may include first and second internal data channels corresponding to each of the channels, first nonvolatile memory devices connected to the first internal data channel, second nonvolatile memory devices connected to the second internal data channel, and an input/output buffer circuit configured to select one of the first and second internal data channels for inputting and outputting data signals when the data signals are input and output through one of the channels.

According to various embodiments, the memory controller may include a solid state drive (SSD) controller. The input/output buffer circuit may include at least one delay locked loop circuit. Moreover, the nonvolatile memory package may include a temperature measuring unit configured to measure a temperature of the nonvolatile memory package and to transfer temperature information corresponding to the temperature to the SSD controller.

A memory system, according to various embodiments, may include a plurality of nonvolatile memories. The memory system may include a memory controller configured to control the plurality of nonvolatile memories. The memory system may include an input/output buffer circuit connected between the memory controller and the plurality of nonvolatile memories. The memory system may include a data channel connected between the memory controller and the input/output buffer circuit. The memory system may include first and second internal data channels connected between the input/output buffer circuit and respective first and second groups of the plurality of nonvolatile memories. Moreover, the input/output buffer circuit may be configured to connect the data channel to one of the first and second internal data channels.

According to various embodiments, the input/output buffer circuit may be configured to provide at least one data signal from at least one of the plurality of nonvolatile memories to the memory controller, via the one of the first and second internal data channels and the data channel. In some embodiments, the input/output buffer circuit may be configured to provide at least one data signal from the memory controller to at least one of the plurality of nonvolatile memories, via the data channel and the one of the first and second internal data channels.

In various embodiments, the input/output buffer circuit may include a temperature measuring unit configured to measure a temperature of a nonvolatile memory package including the plurality of nonvolatile memories and to transfer temperature information corresponding to the temperature to the memory controller.

According to various embodiments, the input/output buffer circuit may include a first input/output unit configured to operate in a program operation. The first input/output unit may include a first receiver configured to receive data signals from the memory controller. The first input/output unit may include a first sampler configured to sample the data signals from the first receiver in response to a first data strobe signal to output first internal data signals. The first input/output unit may include a first delay locked loop circuit configured to generate a first internal data strobe signal by performing delay synchronization on the first data strobe signal. The first input/output unit may include a de-multiplexer configured to connect the data channel to one of the first and second internal data channels in response to at least one first control signal input from the memory controller. The first input/output unit may include first output drivers configured to receive the first internal data signals output from the first sampler via the de-multiplexer and to output the first internal data signals to the one of the first and second internal data channels connected to the data channel. The first internal data strobe signal and the first internal data signals may be output to one of the first and second groups of the plurality of nonvolatile memories. Moreover, input/output buffer circuit may include a second input/output unit configured to operate in a read operation. The second input/output unit may include a second receiver configured to receive second internal data signals from one of the first and second groups of the plurality of nonvolatile memories. The second input/output unit may include a multiplexer configured to connect the data channel to one of the first and second internal data channels based on at least one second control signal input from the memory controller. The second input/output unit may include a second delay locked loop circuit configured to generate a second data strobe signal by delay synchronizing a second internal data strobe signal output from the one of the first and second groups of the plurality of nonvolatile memories from which the second receiver receives the second internal data signals. The second input/output unit may include a second sampler configured to receive the second internal data signals output from the second receiver via the multiplexer and to sample the second internal data signals in response to the second data strobe signal to output second data signals. Moreover, the second input/output unit may include second output drivers configured to output the second data signals that are output from the second sampler, to the data channel, and configured to output the second data strobe signal.

With various embodiments of the present inventive concepts, capacitance of nonvolatile memory devices seen from a controller may be reduced through an input/output buffer circuit which connects a data channel to one of a plurality of internal data channels at a write and a read operation. Thus, although an operating speed may be faster and a data capacity may increase, a memory system according to various embodiments of the present inventive concepts may reduce distortion of data signals.

BRIEF DESCRIPTION OF THE DRAWINGS

The above and other features and advantages of the disclosure will become more apparent in view of the attached drawings and accompanying detailed description.

DETAILED DESCRIPTION

Figure 1:
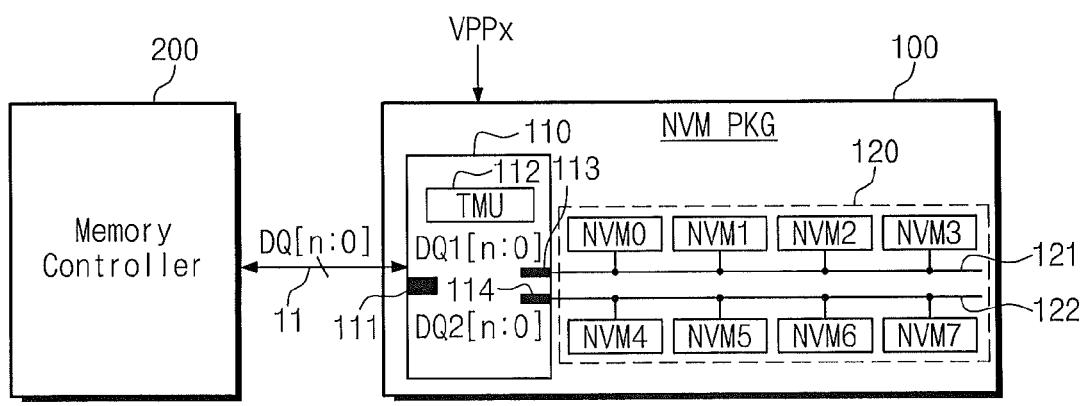
FIG. 1 is diagram schematically illustrating a memory system according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is diagram schematically illustrating a memory system according to various embodiments of the present inventive concepts. Referring to FIG. 1, a memory system 10 may include a nonvolatile memory package 100 and a memory controller 200 for controlling the nonvolatile memory package 100. The nonvolatile memory package 100 may include an input/output buffer circuit 110 and a plurality of nonvolatile memory devices NVM0 to NVM7.

When data signals DQ[n:0] (n being an integer more than 2) are input through a data channel 11, the input/output buffer circuit 110 may connect one of first and second internal data channels 121 and 122 to the memory controller 200. In other words, the input/output buffer circuit 110 may receive control signals from the memory controller 200, transfer the input control signals to the nonvolatile memory devices 120, and exchange data signals corresponding to the input control signals with the nonvolatile memory devices 120.

In some example embodiments, a part of the control signals may be signals shared by the nonvolatile memory devices 120. For example, assuming that each of the nonvolatile memory devices 120 is a NAND flash memory, a command latch enable signal CLE, an address latch enable signal ALE, a write enable signal WEB may be shared by the nonvolatile memory devices 120.

In some example embodiments, a part of the control signals may be signals not shared by the nonvolatile memory devices 120. For example, assuming that each of the nonvolatile memory devices 120 is a NAND flash memory, a chip enable signal CE may be provided to each of the nonvolatile memory devices 120.

In some example embodiments, in a write operation, the data signals DQ[n:0] may be output to first internal data signals DQ1[n:0] or second internal data signals DQ2[n:0] through the input/output buffer circuit 110. Here, the first internal data signals DQ1[n:0] may be sent to first nonvolatile memory devices NVM0 to NVM3 connected to the first internal data channel 121, and the second internal data signals DQ2[n:0] may be sent to second nonvolatile memory devices NVM4 to NVM7 connected to the second internal data channel 122.

In some example embodiments, in a read operation, the first internal data signals DQ1[n:0] read from the first nonvolatile memory devices NVM0 to NVM3 or the second internal data signals DQ2[n:0] read from the second nonvolatile memory devices NVM4 to NVM7 may be output as data signals DQ[n:0] through the input/output buffer circuit 110.

In some example embodiments, the data signals DQ[n:0] may be input and output through data pads 111, the first internal data signals DQ1[n:0] may be input and output through first internal data pads 113 connected with the first internal data channel 121, and the second internal data signals DQ2[n:0] may be input and output through second internal data pads 114 connected with the second internal data channel 122.

Also, the input/output buffer circuit 110 may include a temperature measuring unit 112 for measuring a temperature. Information (hereinafter, referred to as temperature information) associated with a temperature measured by the temperature measuring unit 112 may be provided to the memory controller 200 to control a temperature of the memory system 10.

Each of the nonvolatile memory devices 120 may store data in a write operation and output data in a read operation. Each of the nonvolatile memory devices 120 may be a vertical NAND flash memory, a NOR flash memory, a resistive RAM (RRAM), a phase change RAM (PRAM), a Magnetoresistive RAM (MRAM), a ferroelectric RAM (FRAM), a STT-RAM (Spin Transfer Torque Random Access Memory), and so on. The nonvolatile memory devices 120 may include first nonvolatile memory devices NVM0 to NVM3 connected to the first internal data channel 121 and second nonvolatile memory devices NVM4 to NVM7 connected to the second internal data channel 122.

In FIG. 1, there is illustrated an example where the number of internal data channels is 2. However, the present inventive concepts are not limited thereto. For example, the number of internal data channels may be three or more. Also, there is illustrated an example where four nonvolatile memory devices are connected to a channel. However, the present inventive concepts are not limited thereto. For example, each of the internal data channels 121 and 122 may be connected with at least two nonvolatile memory devices.

The memory controller 200 may control an overall operation of the nonvolatile memory package 100. The memory controller 200 may control the performance of the nonvolatile memory devices 120 using the temperature information provided from the temperature measuring unit 112. The memory controller 200 may perform a thermal throttling function using the temperature information. For example, when the temperature information indicates that a temperature is over a reference, the memory controller 200 may control the nonvolatile memory devices 120 or the memory controller 200 such that generation of heat is reduced.

A memory system may be configured such that an internal data channel corresponds to a data channel. Moreover, an internal data channel may be connected with a plurality of nonvolatile memory devices. As an operating speed is faster and a data capacity increases, capacitance seen from nonvolatile memory devices may increase. As a result, data signals may be seriously distorted in write and read operations of the memory system.

On the other hand, the memory system 10 according to various embodiments of the present inventive concepts may include the input/output buffer circuit 110 for connecting one of a plurality of internal data channels 121 and 122 to a data channel in read and write operations, so that capacitance seen from nonvolatile memory devices is reduced. Thus, although an operating speed may be faster and a data capacity may increase, a phenomenon of data signals that are distorted may be reduced.

Figure 2:
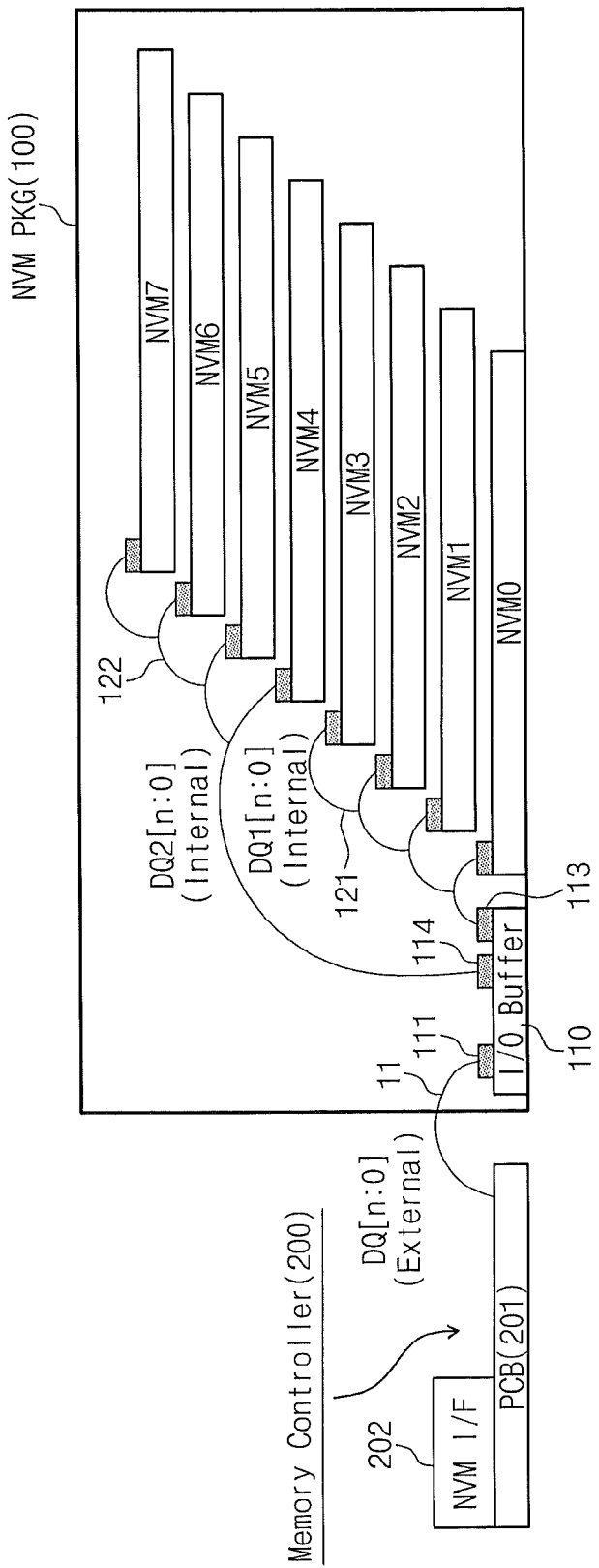
FIG. 2 is a diagram schematically illustrating a stack structure of a nonvolatile memory package according to various embodiments.

The nonvolatile memory package 100 according to some embodiments of the present inventive concepts may be implemented to have such a structure that the nonvolatile memory devices 120 are stacked. For example, FIG. 2 is a diagram schematically illustrating a stack structure of a nonvolatile memory package 100 according to various embodiments of the present inventive concepts. Referring to FIG. 2, a nonvolatile memory package 100 may include an input/output buffer circuit 110 and stacked nonvolatile memory devices NVM0 to NVM7.

The input/output buffer circuit 110 may include data pads 111 for receiving and outputting data signals DQ[n:0] from and to a memory controller 200, first internal data pads 113 for receiving and outputting first internal data signals DQ1[n:0], and second internal data pads 114 for receiving and outputting second internal data signals DQ2[n:0]. Here, the first internal data signals DQ1[n:0] may be received and output through first nonvolatile memory devices NVM0 to NVM3 and a first internal data channel 121, and the second internal data signals DQ2[n:0] may be received and output through second nonvolatile memory devices NVM4 to NVM7 and a second internal data channel 122.

In some example embodiments, the data channel 11, the first internal data channel 121, and the second internal data channel 122 may be implemented by wire bonding, respectively. In some example embodiments, the input/output buffer circuit 110 and the first nonvolatile memory device NVM0 may be formed at the same layer.

In some example embodiments, the memory controller 200 may be formed on a printed circuit board 201 as illustrated in FIG. 2. Also, a nonvolatile interface circuit 202 for interfacing with the nonvolatile memory package 100 may be formed on the printed circuit board 201.

In FIG. 2, there is illustrated an example in which the input/output buffer circuit 110 is spaced apart from the stacked nonvolatile memory devices NVM0 to NVM7. However, the present inventive concepts are not limited thereto. For example, the nonvolatile memory package 100 may be implemented such that the input/output buffer circuit 110 is stacked on the nonvolatile memory devices NVM0 to NVM7. Moreover, in FIG. 2, a structure in which the nonvolatile memory devices NVM0 to NVM7 are stacked may be modified or changed in various methods.

Figure 3:
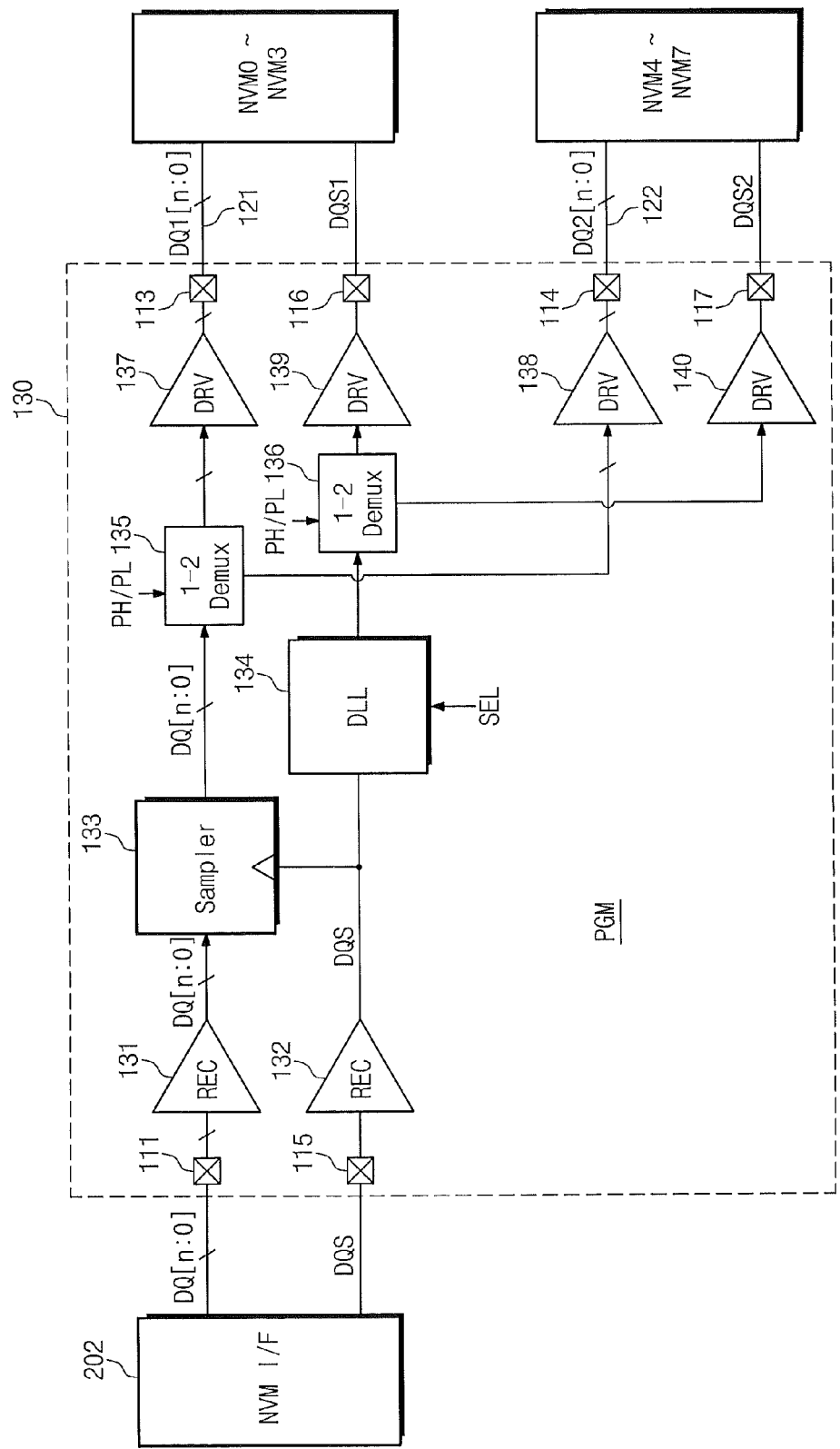
FIG. 3 is a diagram schematically illustrating a first input/output unit of an input/output buffer circuit in a program operation according to various embodiments.

FIG. 3 is a diagram schematically illustrating a first input/output unit 130 of an input/output buffer circuit 110 in a program operation according to various embodiments of the present inventive concepts. Referring to FIG. 3, a first input/output unit 130 may include first receivers 131 and 132, a first sampler 133, a first delay locked loop circuit 134, first de-multiplexers 135 and 136, and first output drivers 137 to 140.

An input/output process of data signals DQ[n:0] in a program operation may be as follows. Data signals DQ[n:0] input through pads 111 may be received by the first receiver 131, and the first sampler 133 may sample the data signals DQ[n:0] in response to a data strobe signal DQS. Here, the data strobe signal DQS may be received through a pad 115, and the receiver 132 may receive the data strobe signal DQS provided through the pad 115. The first delay locked loop circuit 134 may generate an internal data strobe signal DQS1/DQS2 by performing delay synchronization on the received data strobe signal DQS.

Instead of the first delay locked loop circuit 134, a phase locked loop circuit may be used to generate an internal data strobe signal DQS1/DQS2. Alternatively, in the event that a clock is received from a memory controller 200 (e.g., as illustrated in FIG. 1), the first delay locked loop circuit 134 for generating an internal data strobe signal DQS1/DQS2 may not be required. A clock received from the memory controller 200 may be used to generate an internal data strobe signal DQS1/DQS2.

Data signals DQ[n:0] output from the first sampler 133 may be output to the output drivers 137 or the output drivers 138 through the de-multiplexer 135. Here, the de-multiplexer 135 may respond to a selection signal PH/PL to select whether to transfer data signals DQ[n:0] to the first internal data channel 121 or the second internal data channel 122. Here, the selection signal PH/PL may be generated using at least one control signal such as a chip enable signal CE.

First internal data signals DQ1[n:0] output from the output drivers 137 may be transferred to the first internal data channel 121 through first internal pads 113. Here, the first internal data channel 121 may be connected with first nonvolatile memories NVM0 to NMV3. Also, second internal data signals DQ2[n:0] output from the output drivers 138 may be transferred to the second internal data channel 122 through second internal pads 114. Here, the second internal data channel 122 may be connected with second nonvolatile memories NVM4 to NMV7.

Also, an internal data strobe signal DQS1/DQS2 output from the first delay locked loop circuit 134 in response to a selection signal SEL may be output to one of third and fourth output drivers 139 and 140 through the de-multiplexer 136. Here, the de-multiplexer 136 may select a signal path of the internal data strobe signal DQS1/DQS2 in response to the selection signal PH/PL. The first internal data strobe signals DQS1 output from the output drivers 139 may be transferred to the first internal data channel 121 through an internal pad 116. Also, the second internal data strobe signals DQS2 output from the output drivers 140 may be transferred to the second internal data channel 122 through an internal pad 117.

The first input/output unit 130 according to some embodiments of the present inventive concepts may receive data signals DQ[n:0] and data strobe signal DQS, recover the input data signals DQ[n:0] and data strobe signal DQS, and transfer the recovered data signals DQ[n:0] and data strobe signal DQS to corresponding internal data channels 121 and 122.

Figure 4:
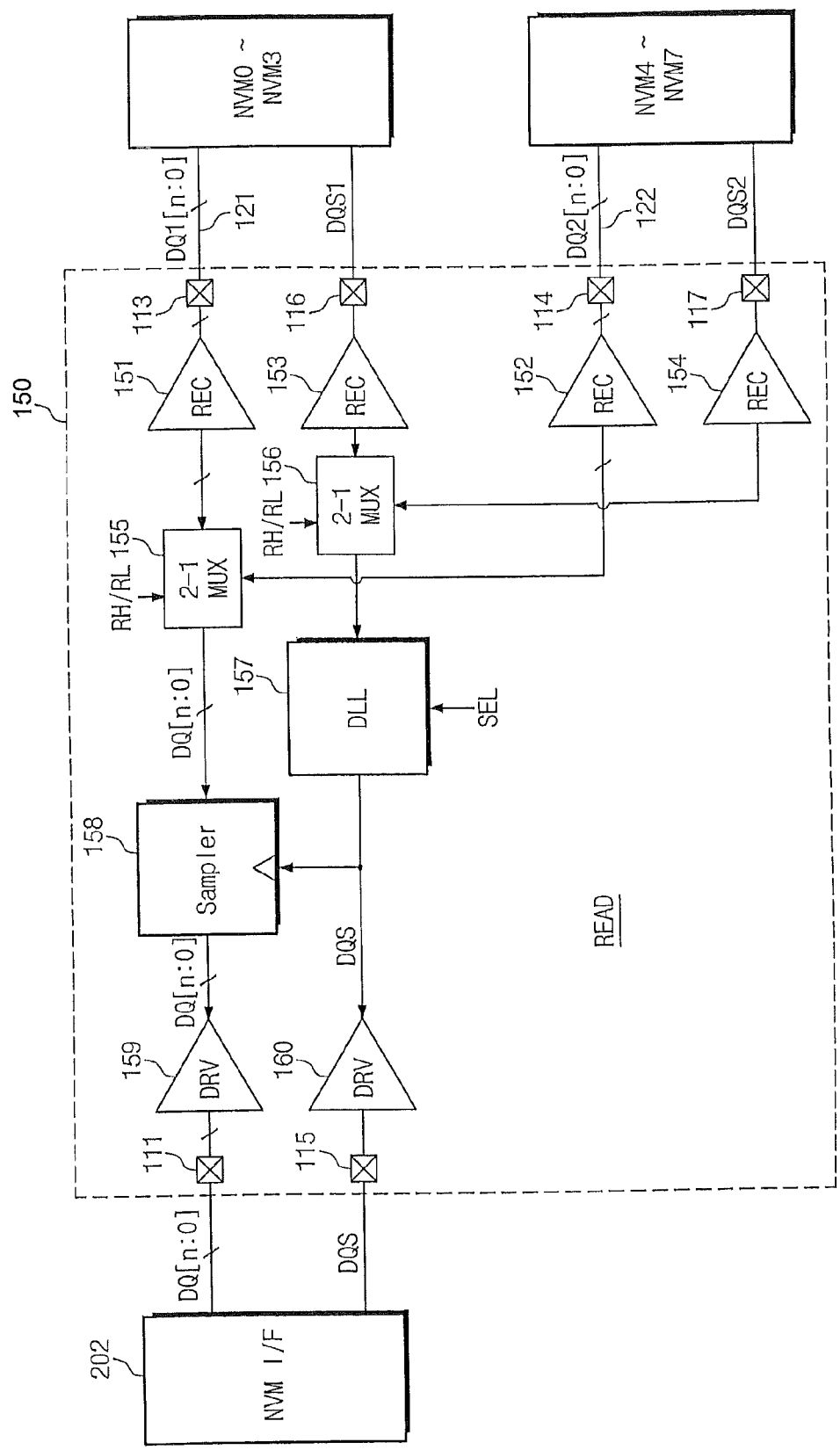
FIG. 4 is a diagram schematically illustrating a second input/output unit of an input/output buffer circuit in a read operation according to various embodiments.

FIG. 4 is a diagram schematically illustrating a second input/output unit 150 of an input/output buffer circuit 110 in a read operation according to various embodiments of the present inventive concepts. Referring to FIG. 4, a second input/output unit 150 may include second receivers 151 to 154, multiplexers 155 and 156, a second delay locked loop circuit 157, a second sampler 158, and second output drivers 159 and 160. An input/output process of data signal DQ[n:0] in a read operation may be opposite to that described with reference to FIG. 3.

A first delay locked loop circuit 134 of a first input/output unit 130 of FIG. 3 may be equal to the second delay locked loop circuit 157 of the second input/output unit 150 of FIG. 4. In this case, the delay locked loop circuit 134/157 may be used at a program or read operation in response to a selection signal SEL. Moreover, a nonvolatile memory device according to some embodiments of the present inventive concepts may be a NAND flash memory.

Figure 5:
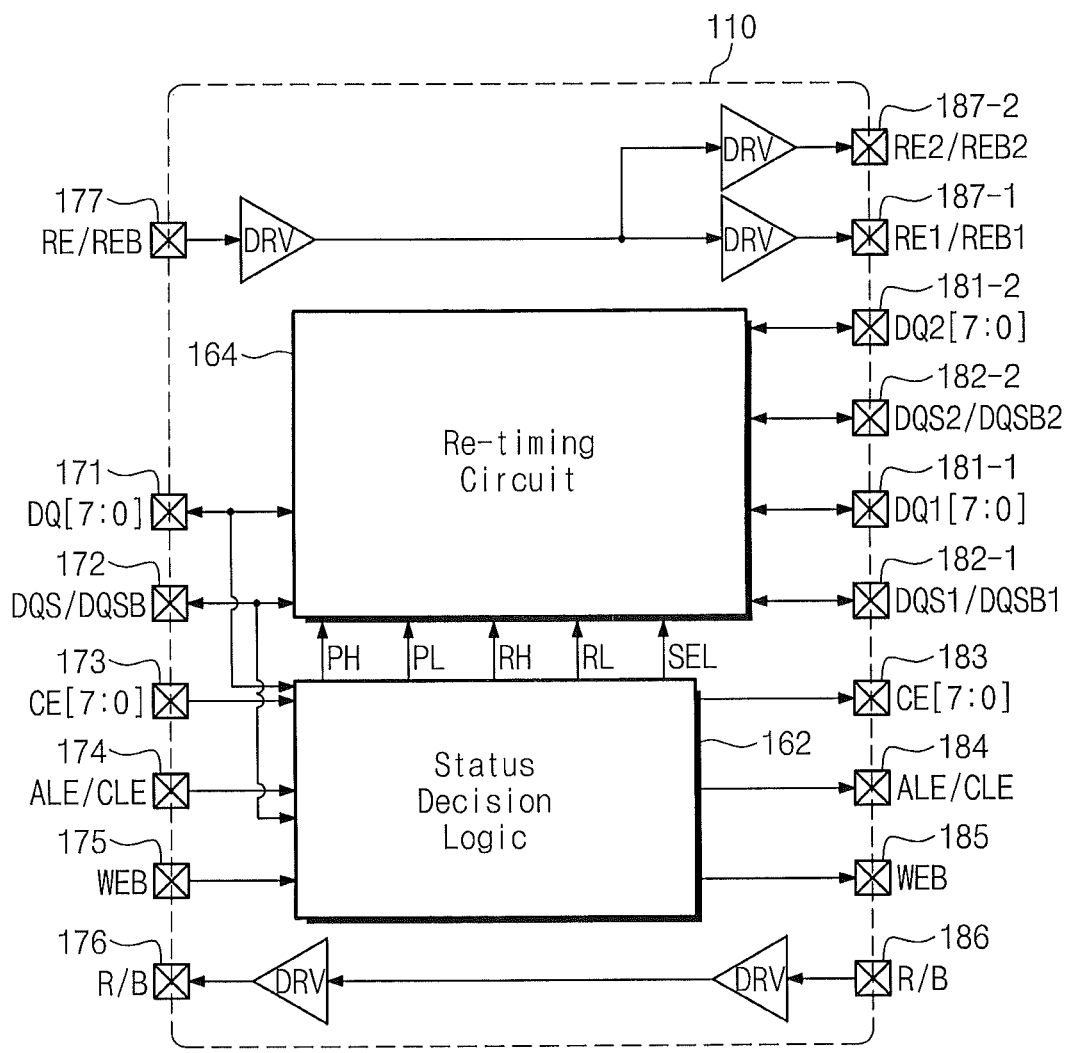
FIG. 5 is a block diagram schematically illustrating an input/output buffer circuit when a nonvolatile memory device is a NAND flash memory.

FIG. 5 is a block diagram schematically illustrating an input/output buffer circuit 110 when a nonvolatile memory device is a NAND flash memory. Referring to FIG. 5, an input/output buffer circuit 110 may include a status decision logic circuit 162 and a re-timing circuit 164.

The status decision logic circuit 162 may logically combine control signals CE[7:0], ALE/CLE, WEB, and DQS/DQSB and data signals DQ[7:0] to generate selection signals PH, PL, RH, RL, and SEL for deciding an operation of the re-timing circuit 164.

The re-timing circuit 164 may perform an operation of a first input/output unit 130 (refer to FIG. 3) or an operation of a second input/output unit 150 (refer to FIG. 4) in response to the selection signals PH, PL, RH, RL, and SEL from the status decision logic circuit 162. Here, the selection signals PH, PL, RH, and RL may be provided to de-multiplexers 135, 136, multiplexers 155, 156 illustrated in FIGS. 3 and 4. Also, the selection signal SEL may be provided to a sampler 133/158 or a delay locked loop circuit 135/157.

Referring to FIG. 5, data pads 171 for input/output of the data signals DQ[7:0] may be connected to first internal data pads 181_1 or second internal data pads 181_2 through the re-timing circuit 164. Data strobe pads 172 for input/output of data strobe signals DQS/DQSB may be connected to first internal data strobe pads 182_1 or second internal data strobe pads 182_2 through the re-timing circuit 164.

Chip enable pads 173 for input of chip enable signals CE[7:0] may be connected to internal chip enable pads 183 through the status decision logic circuit 162. Address latch enable/command latch enable pads 174 for input of an address latch enable signal/command latch enable signal may be connected to internal address latch enable/command latch enable pads 184 through the status decision logic circuit 162. A write enable pad 175 for input of a write enable signal WEB may be connected to an internal write enable pad 185 through the status decision logic circuit 162.

A ready/busy pad 175 for output of a ready/busy signal RnB may be connected to an internal ready/busy pad 186 through output drivers. Pads 177 for input of read enable signals RE/REB may be connected to first internal read enable pads 187_1 through a driver and to second internal read enable pads 187_2 through a driver.

Meanwhile, nonvolatile memory devices seen from a memory controller 200 may be one of two groups MVM0 to NVM3 and NVM4 to NVM7. However, the present inventive concepts are not limited thereto. For example, volatile memory devices seen from the memory controller 200 may be implemented by one of three groups.

Figure 6:
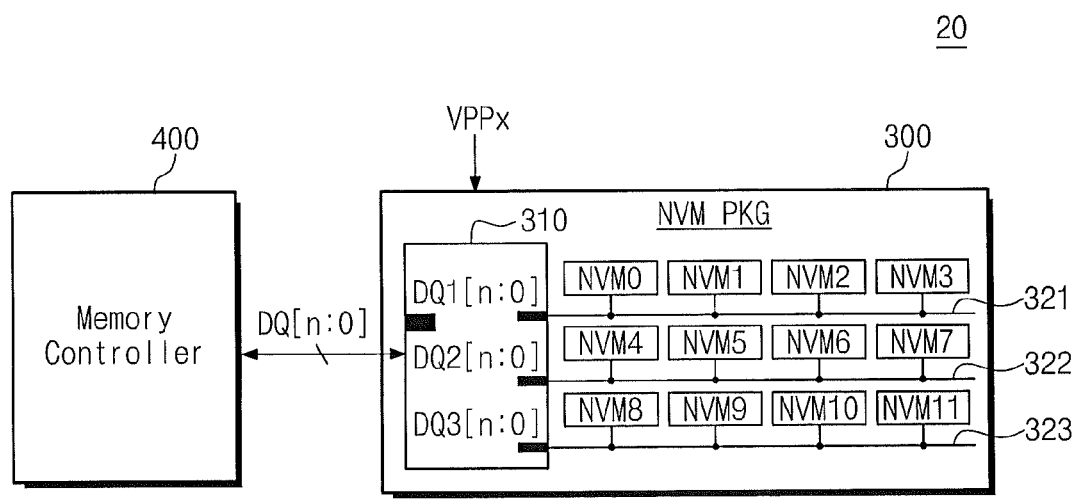
FIG. 6 is a diagram schematically illustrating a memory system according to various embodiments.

FIG. 6 is a diagram schematically illustrating a memory system 20 according to various embodiments of the present inventive concepts. Referring to FIG. 6, a memory system 20 may include a nonvolatile memory package 300 and a memory controller 400 for controlling the nonvolatile memory package 300. One of three memory groups NVM0 to NVM3, NVM4 to NVM7, and NVM8 to NVM11 may be seen from the memory controller 400 at a read or write operation. Moreover, it will be understood that the present inventive concepts are applicable to a solid state drive (SSD).

Figure 7:
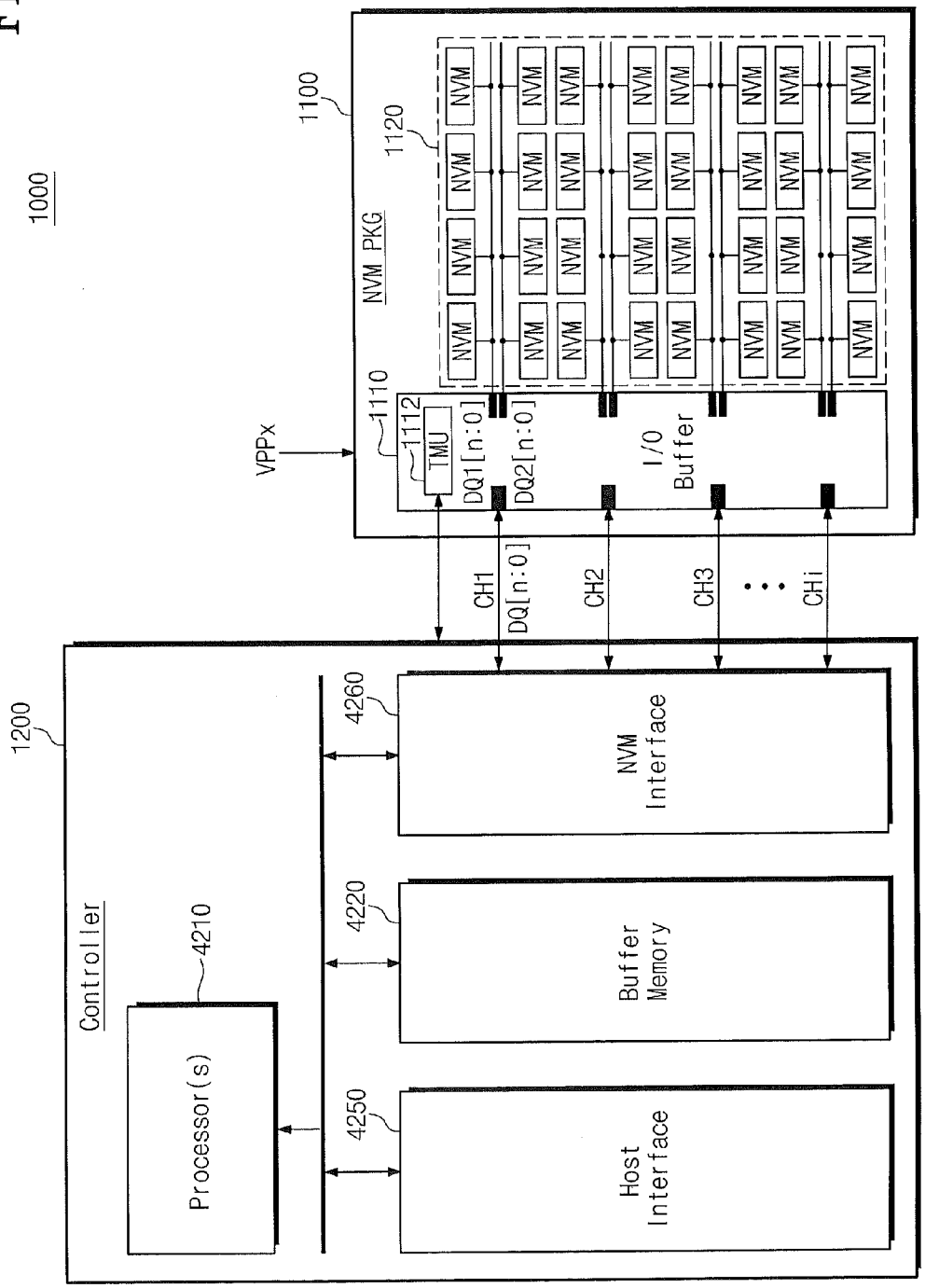
FIG. 7 is a block diagram schematically illustrating a solid state drive (SSD) according to various embodiments.

FIG. 7 is a block diagram schematically illustrating an SSD according to various embodiments of the present inventive concepts. Referring to FIG. 7, an SSD 1000 may include a nonvolatile memory package 1100 and an SSD controller 1200.

The nonvolatile memory package 1100 may be connected to the SSD controller 1200 through a plurality of channels CH1 to CHi (i being an integer of 2 or more). The nonvolatile memory package 1100 may include an input/output buffer chip 1110 and a plurality of nonvolatile memory device groups 1120. The input/output buffer chip 1110 may be equal to an input/output buffer chip 110 in FIGS. 1 to 6. The SSD controller 1200 may include at least one processor 4210, a buffer memory 4220, a host interface 4250, and a nonvolatile interface 4260.

In FIGS. 1 to 7, there is described an example where a memory controller and a nonvolatile memory package are formed of separate chips, respectively. However, the present inventive concepts are not limited thereto. For example, a memory controller and nonvolatile memories may be implemented by a chip on a printed circuit board. For example, the present inventive concepts are applicable to an embedded multimedia card (eMMC).

Figure 8:
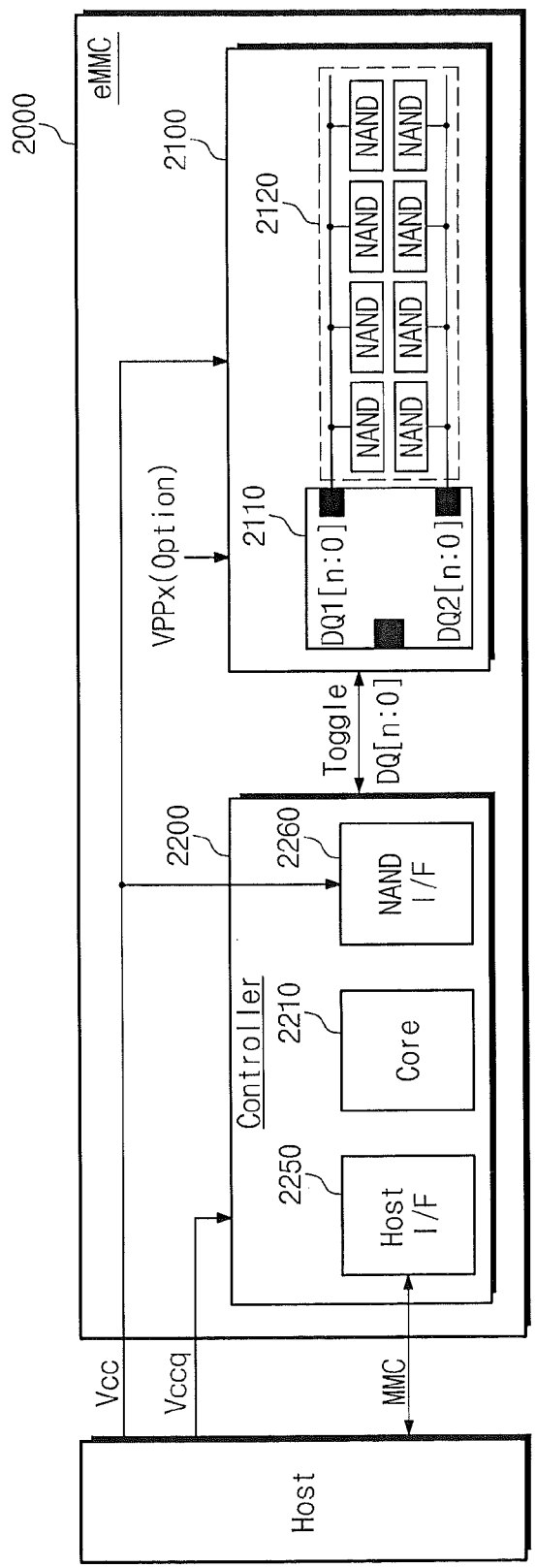
FIG. 8 is a block diagram schematically illustrating an embedded multimedia card (eMMC) according to various embodiments.

FIG. 8 is a block diagram schematically illustrating an eMMC according to various embodiments of the present inventive concepts. Referring to FIG. 8, an eMMC 2000 may include a nonvolatile memory portion 2100 and a controller 2200 for controlling the nonvolatile memory portion 2100. The nonvolatile memory portion 2100 may correspond to a nonvolatile memory package 100 of FIG. 1. The nonvolatile memory portion 2100 may include a plurality of NAND flash memory devices and an input/output buffer circuit 2110. The controller 2200 may include a core 2210, a host interface circuit 2250, and a NAND interface circuit 2260. The host interface circuit 2250 may be formed of an MMC interface.

The eMMC 2000 may be supplied with power supply voltages Vcc and Vccq from a host. Here, the power supply voltage Vcc (e.g., 3.3V) may be provided to the nonvolatile memory portion 2100 and the NAND interface circuit 2260, and the power supply voltage Vccq (e.g., 1.8V/3.3V) may be provided to the controller 2200. In example embodiments, the eMMC 2000 may be optionally supplied with an external high voltage VPPx.

The eMMC 2000 according to some embodiments of the present inventive concepts may be advantageous to store mass data, and may perform high-speed read and write operations. Thus, the eMMC 2000 according to some embodiments of the present inventive concepts may be applicable to smallsized and low-power mobile products (e.g., Galaxy S, Galaxy note, Galaxy tap, iPhone, iPad, nexus, etc.).

In FIGS. 1 to 8, there is described an example where an input/output buffer circuit (or, buffer chip) 110 is directly connected to nonvolatile memory devices NVM0 to NVM7. However, the present inventive concepts are not limited thereto. For example, the input/output buffer circuit may be connected to the nonvolatile memory devices NVM0 to NVM7 through a printed circuit board.

Figure 9:
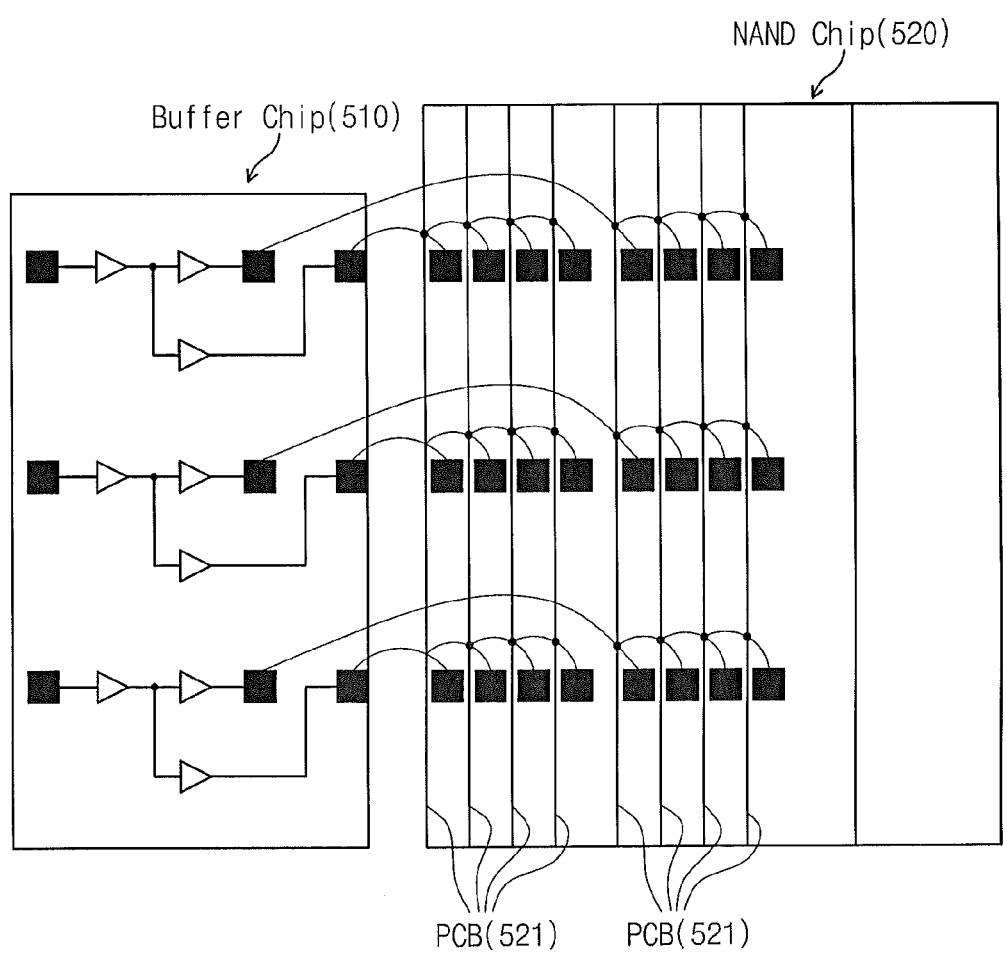
FIG. 9 illustrates a nonvolatile memory package with a side-by-side structure according to various embodiments.

FIG. 9 illustrates a nonvolatile memory package 500 with a side-by-side structure. Referring to FIG. 9, a nonvolatile memory package 500 may include a buffer chip 510 and a NAND chip 520 having a side-by-side structure. The buffer chip 510 and the NAND chip 520 may be connected through a printed circuit board 521. The nonvolatile memory package 500 according to some embodiments of the present inventive concepts may reduce a power noise and increase/maximize structural stability, by connecting the buffer chip 510 and the NAND chip 520 through the printed circuit board 521.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A memory system, comprising:
a nonvolatile memory package;
a memory controller configured to control the nonvolatile memory package, wherein the nonvolatile memory package comprises groups of nonvolatile memory devices respectively connected to internal data channels; and
an input/output buffer circuit configured to connect a data channel to one of the internal data channels when data signals are input to or output from the memory controller via the data channel, wherein the input/output buffer circuit comprises an input/output unit configured to operate in a program operation, wherein the input/output unit comprises:
a receiver configured to receive the data signals from the memory controller;
a sampler configured to sample the data signals from the receiver in response to a data strobe signal to output internal data signals;
a delay locked loop circuit configured to generate an internal data strobe signal by performing delay synchronization on the data strobe signal;
a de-multiplexer configured to connect the data channel to one of the internal data channels based on at least one control signal input from the memory controller; and
output drivers configured to receive the internal data signals output from the sampler via the de-multiplexer and to output the internal data signals to the one of the internal data channels connected to the data channel, and wherein the internal data strobe signal and the internal data signals are output to one of the groups of nonvolatile memory devices.

2. The memory system of claim 1, wherein the nonvolatile memory devices comprise stacked nonvolatile memory devices.

3. The memory system of claim 2, wherein the input/output buffer circuit is directly connected to the stacked nonvolatile memory devices via wire bonding.

4. The memory system of claim 2, wherein:
the input/output buffer circuit and the stacked nonvolatile memory devices are connected via a printed circuit board;
at least one of the stacked nonvolatile memory devices is on the printed circuit board; and
the input/output buffer circuit and the stacked nonvolatile memory devices have a side-by-side structure.

5. The memory system of claim 1, wherein the nonvolatile memory package and the memory controller are in a chip on a printed circuit board.

6. The memory system of claim 1, wherein the nonvolatile memory package and the memory controller comprise separate chips, respectively.

7. The memory system of claim 6, wherein the memory controller is on a printed circuit board.

8. The memory system of claim 1, wherein the input/output buffer circuit further comprises:
a temperature measuring unit configured to measure a temperature of the nonvolatile memory package and to transfer temperature information corresponding to the temperature to the memory controller.

9. The memory system of claim 1, wherein:
the input/output unit comprises a first input/output unit;
the receiver comprises a first receiver;
the data signals comprise first data signals;
the at least one control signal comprises at least one first control signal;
the delay locked loop circuit comprises a first delay locked loop circuit;
the internal data strobe signal and the data strobe signal comprise a first internal data strobe signal and a first data strobe signal, respectively;
the output drivers comprise first output drivers;
the input/output buffer circuit further comprises a second input/output unit configured to operate in a read operation; and
the second input/output unit comprises:
a second receiver configured to receive second internal data signals from one of the groups of nonvolatile memory devices connected to a first or second one of the internal data channels;
a multiplexer configured to connect the data channel to the first or second one of the internal data channels based on at least one second control signal input from the memory controller;
a second delay locked loop circuit configured to generate a second data strobe signal by delay synchronizing a second internal data strobe signal output from the one of the groups of nonvolatile memory devices connected to the first or second one of the internal data channels;
a second sampler configured to receive the second internal data signals output from the second receiver via the multiplexer and to sample the second internal data signals in response to the second data strobe signal to output second data signals; and
second output drivers configured to output the second data signals that are output from the second sampler, to the data channel, and configured to output the second data strobe signal.

10. The memory system of claim 1, wherein the input/output buffer circuit is configured to, in the program operation or a read operation, sample data signals in response to a clock transferred from the memory controller to input and output the sampled data signals.

11. The memory system of claim 1, wherein the internal data channels comprise a first internal data channel and a second internal data channel.

12. The memory system of claim 11, wherein the input/output buffer circuit comprises:
a re-timing circuit configured to connect the data channel to the first internal data channel or the second internal data channel in response to a selection signal during the program operation or a read operation; and
a status decision logic circuit configured to receive a control signal from the memory controller and to generate the selection signal using the control signal.

13. The memory system of claim 12, wherein the input/output buffer circuit further comprises:
a read enable pad configured to receive a read enable signal from the memory controller; and
first and second internal read enable pads connected to the read enable pad via at least one output driver.

14. A memory system comprising:
a plurality of nonvolatile memories;
a memory controller configured to control the plurality of nonvolatile memories;
an input/output buffer circuit connected between the memory controller and the plurality of nonvolatile memories;
a data channel connected between the memory controller and the input/output buffer circuit; and
first and second internal data channels connected between the input/output buffer circuit and respective first and second groups of the plurality of nonvolatile memories,
wherein the input/output buffer circuit is configured to connect the data channel to one of the first and second internal data channels, and
wherein the input/output buffer circuit and the plurality of nonvolatile memories have a side-by-side structure, wherein the input/output buffer circuit further comprises:
a temperature measuring unit configured to measure a temperature of a nonvolatile memory package comprising the plurality of nonvolatile memories and to transfer temperature information corresponding to the temperature to the memory controller;
a first input/output unit configured to operate in a program operation, the first input/output unit comprising:
a first receiver configured to receive data signals from the memory controller;
a first sampler configured to sample the data signals from the first receiver in response to a first data strobe signal to output first internal data signals;
a first delay locked loop circuit configured to generate a first internal data strobe signal by performing delay synchronization on the first data strobe signal;
a de-multiplexer configured to connect the data channel to one of the first and second internal data channels in response to at least one first control signal input from the memory controller; and
first output drivers configured to receive the first internal data signals output from the first sampler via the de-multiplexer and to output the first internal data signals to the one of the first and second internal data channels connected to the data channel, wherein the first internal data strobe signal and the first internal data signals are output to one of the first and second groups of the plurality of nonvolatile memories; and
a second input/output unit configured to operate in a read operation, the second input/output unit comprising:
a second receiver configured to receive second internal data signals from one of the first and second groups of the plurality of nonvolatile memories;
a multiplexer configured to connect the data channel to one of the first and second internal data channels based on at least one second control signal input from the memory controller;
a second delay locked loop circuit configured to generate a second data strobe signal by delay synchronizing a second internal data strobe signal output from the one of the first and second groups of the plurality of nonvolatile memories from which the second receiver receives the second internal data signals;
a second sampler configured to receive the second internal data signals output from the second receiver via the multiplexer and to sample the second internal data signals in response to the second data strobe signal to output second data signals; and
second output drivers configured to output the second data signals that are output from the second sampler, to the data channel, and configured to output the second data strobe signal.

15. The memory system of claim 14, wherein the input/output buffer circuit is configured to provide at least one data signal from at least one of the plurality of nonvolatile memories to the memory controller, via the one of the first and second internal data channels and the data channel.

16. The memory system of claim 14, wherein the input/output buffer circuit is configured to provide at least one data signal from the memory controller to at least one of the plurality of nonvolatile memories, via the data channel and the one of the first and second internal data channels.

* * * * *